(12) United States Patent
Choi et al.

(10) Patent No.: US 9,843,316 B2
(45) Date of Patent: Dec. 12, 2017

(54) INTEGRATED CIRCUITS RELATING TO TRANSMISSION DATA AND LATCH CLOCK SIGNALS

(71) Applicant: SK hynix Inc., Icheon-si Gyeonggi-do (KR)

(72) Inventors: Hae Rang Choi, Gwangju-si (KR); Dae Han Kwon, Seoul (KR); Hyung Soo Kim, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/233,025

(22) Filed: Aug. 10, 2016

(65) Prior Publication Data

US 2017/0272064 A1    Sep. 21, 2017

(30) Foreign Application Priority Data

Mar. 17, 2016    (KR) .................. 10-2016-0032403

(51) Int. Cl.
| | | |
|---|---|---|
| *H03K 3/00* | (2006.01) | |
| *H03K 5/15* | (2006.01) | |
| *G11C 7/10* | (2006.01) | |
| *G11C 7/22* | (2006.01) | |
| *H03K 3/037* | (2006.01) | |
| *H03K 5/00* | (2006.01) | |

(52) U.S. Cl.
CPC ......... *H03K 5/15013* (2013.01); *G11C 7/106* (2013.01); *G11C 7/222* (2013.01); *H03K 3/037* (2013.01); *H03K 2005/00019* (2013.01)

(58) Field of Classification Search
CPC ............... H03K 5/15013; H03K 3/037; H03K 2005/00019; G11C 7/106; G11C 7/222
See application file for complete search history.

(56) References Cited

U.S. PATENT DOCUMENTS

| 6,813,724 | B2* | 11/2004 | Saito | G06F 13/423 |
| | | | | 327/149 |
| 7,180,343 | B2* | 2/2007 | Shin | H04L 7/0075 |
| | | | | 327/141 |
| 7,367,004 | B2 | 4/2008 | Katou | |
| 8,375,239 | B2* | 2/2013 | Nara | G06F 1/08 |
| | | | | 327/175 |
| 2009/0174455 | A1 | 7/2009 | Dimitriu et al. | |

FOREIGN PATENT DOCUMENTS

KR    1020110076135 A    7/2011

* cited by examiner

*Primary Examiner* — Kenneth B Wells
(74) *Attorney, Agent, or Firm* — William Park & Associates Ltd.

(57) ABSTRACT

An integrated circuit may be provided. The integrated circuit may include a transmitter and a receiver. The transmitter outputs first transmission data to a first channel and outputs second transmission data to a second channel. The phase of the first transmission data transmitted through the first channel is different from a phase of the second transmission data transmitted through the second channel.

21 Claims, 9 Drawing Sheets

INTEGRATED CIRCUITS RELATING TO TRANSMISSION DATA AND LATCH CLOCK SIGNALS

CROSS-REFERENCE TO RELATED APPLICATIONS

The present application claims priority under 35 U.S.C 119(a) to Korean Patent Application No. 10-2016-0032403, filed on Mar. 17, 2016, which is herein incorporated by references in its entirety.

BACKGROUND

1. Technical Field

Embodiments of the present disclosure may generally relate to integrated circuits relating to the transmission of data.

2. Related Art

In integrated circuits, data may be transmitted through physical channels disposed between a plurality of circuits. In such a case, a reflection phenomenon, an inter-symbol interference phenomenon, a cross-talk phenomenon or a skin effect may occur in the channels to deform or distort waveforms of the data transmitted through the channels. Accordingly, various techniques such as an equalization technique, a cross-talk cancellation technique and a data encoding technique have been developed and used to suppress the various phenomena that deform or distort the waveforms of the data.

Recently, various techniques have been proposed to remove the various phenomena such as the reflection phenomenon, the inter-symbol interference phenomenon, the cross-talk phenomenon and the skin effect, because not only do integrated circuits transmitting data using a serial interface scheme but also integrated circuits receiving and transmitting data using a parallel interface scheme operate at high speeds. In particular, since each of semiconductor systems among the integrated circuits is realized using a multi-drop scheme that is configured to include a single controller and a plurality of semiconductor devices connected in parallel to the single controller, the semiconductor system may be more highly influenced by the reflection phenomenon, the inter-symbol interference phenomenon, the cross-talk phenomenon or the skin effect. Accordingly, the waveforms of the data transmitted through the channels may be more distorted or deformed.

A termination technique may be used to remove the reflection phenomenon occurring in the channels. An equalization technique may be used to remove the inter-symbol interference phenomenon. Also, a physical shielding technique or the data encoding technique may be used to remove the cross-talk phenomenon. However, in the event that the physical shielding technique or the data encoding technique is applied to the semiconductor systems realized using the multi-drop scheme including a plurality of channels, the circuits of the semiconductor systems may become more complicated increasing the manufacturing costs thereof.

SUMMARY

According to an embodiment, an integrated circuit may be provided. The integrated circuit may include a transmitter and a receiver. The transmitter outputs first transmission data to a first channel and outputs second transmission data to a second channel. The phase of the first transmission data transmitted through the first channel is different from a phase of the second transmission data transmitted through the second channel.

According to another embodiment, an integrated circuit includes a first output circuit, a second output circuit, a first input circuit and a second input circuit. The first output circuit selects a first latch clock signal in response to a first data selection signal and latches output data to output the latched output data as first transmission data in synchronization with the first latch clock signal. The first transmission data are outputted to a first channel. The second output circuit selects a second latch clock signal in response to a second data selection signal and latches output data to output the latched output data as second transmission data in synchronization with the second latch clock signal. The second transmission data are outputted to a second channel. The first input circuit selects a third latch clock signal in response to the first data selection signal and latches the first transmission data to generate input data in synchronization with the third latch clock signal. The second input circuit selects a fourth latch clock signal in response to the second data selection signal and latches the second transmission data to generate the input data in synchronization with the fourth latch clock signal.

According to another embodiment, an integrated circuit includes a first output circuit, a second output circuit, a third output circuit, a first input circuit, a second input circuit and a third input circuit. The first output circuit selects a first latch clock signal in response to a first group selection signal and latches output data to output the latched output data as first transmission data in synchronization with the first latch clock signal. The first transmission data are outputted to a first channel. The second output circuit selects a second latch clock signal in response to the first group selection signal and latches the output data to output the latched output data as second transmission data in synchronization with the second latch clock signal. The second transmission data are outputted to a second channel. The third output circuit selects a third latch clock signal in response to a second group selection signal and latches the output data to output the latched output data as third transmission data in synchronization with the third latch clock signal. The third transmission data are outputted to a third channel. The first input circuit selects a fourth latch clock signal in response to the first group selection signal and latches the first transmission data to generate input data in synchronization with the fourth latch clock signal. The second input circuit selects a fifth latch clock signal in response to the first group selection signal and latches the second transmission data to generate the input data in synchronization with the fifth latch clock signal. The third input circuit selects a sixth latch clock signal in response to the second group selection signal and latches the third transmission data to generate the input data in synchronization with the sixth latch clock signal.

DETAILED DESCRIPTION

Embodiments of the present disclosure will be described hereinafter with reference to the accompanying drawings. However, the embodiments described herein are for illustrative purposes only and are not intended to limit the scope of the present disclosure.

Various embodiments may be directed to integrated circuits transmitting data.

Figure 1:
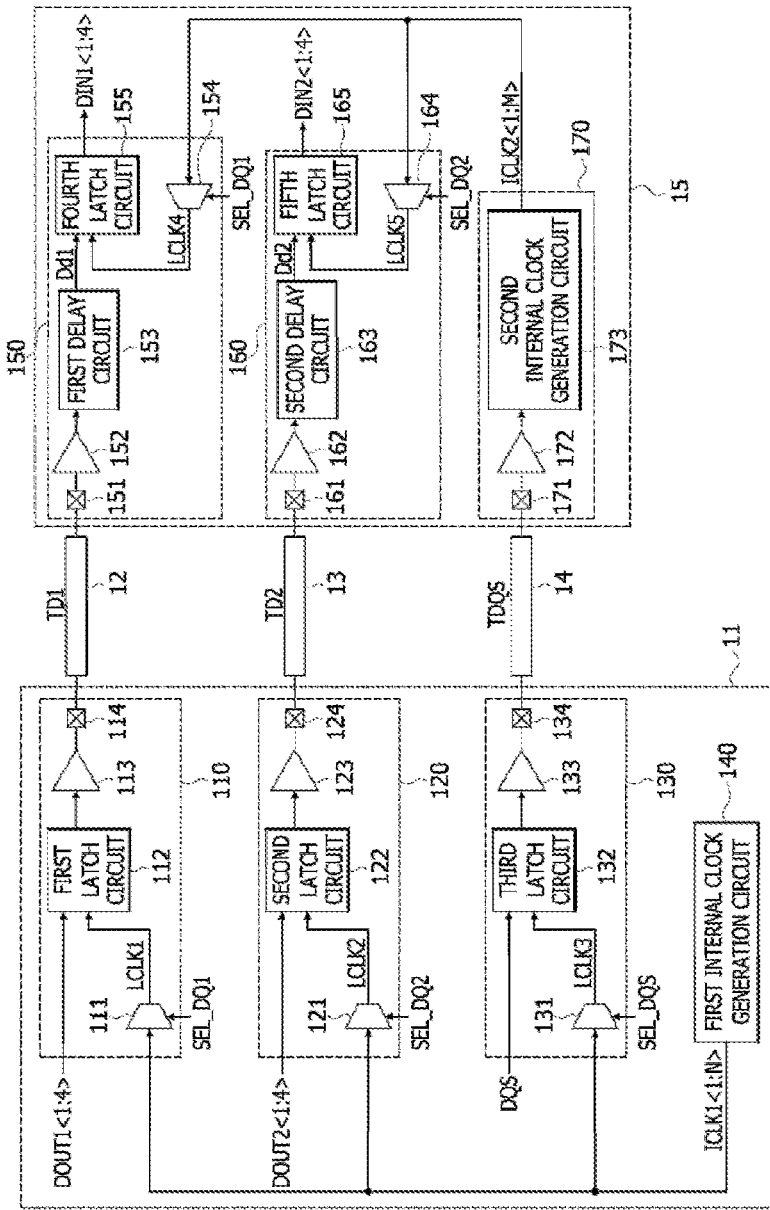
FIG. 1 is a block diagram illustrating a representation of an example of an integrated circuit according to an embodiment.

Referring to FIG. 1, an integrated circuit according to an embodiment may include a transmitter 11, a first channel 12, a second channel 13, a third channel 14 and a receiver 15. The transmitter 11 may transmit first transmission data TD1 to the receiver 15 through the first channel 12. The transmitter 11 may transmit second transmission data TD2 to the receiver 15 through the second channel 13. The transmitter 11 may transmit a transmission data strobe signal TDQS to the receiver 15 through the third channel 14. The transmitter 11 may include a first output circuit 110, a second output circuit 120, a third output circuit 130 and a first internal clock generation circuit 140. The receiver 15 may include a first input circuit 150, a second input circuit 160 and a third input circuit 170.

The first output circuit 110 may include a first selector 111, a first latch circuit 112, a first driver 113 and a first pad 114. The first selector 111 may selectively output any one of first internal clock signals ICLK1<1:N> as a first latch clock signal LCLK1 in response to a first data selection signal SEL_DQ1. The first internal clock signals ICLK1<1:N> may include a plurality of clock signals having a plurality of phases. The first latch circuit 112 may latch and output first output data DOUT1<1:4> in synchronization with the first latch clock signal LCLK1. The first driver 113 may drive and output the first output data DOUT1<1:4> outputted from the first latch circuit 112 as the first transmission data TD1 through the first pad 114. The first data selection signal SEL_DQ1 may be generated in the transmitter 11 or may be provided by an external device.

The second output circuit 120 may include a second selector 121, a second latch circuit 122, a second driver 123 and a second pad 124. The second selector 121 may selectively output any one of the first internal clock signals ICLK1<1:N> as a second latch clock signal LCLK2 in response to a second data selection signal SEL_DQ2. The second latch circuit 122 may latch and output second output data DOUT2<1:4> in synchronization with the second latch clock signal LCLK2. The second driver 123 may drive and output the second output data DOUT2<1:4> outputted from the second latch circuit 122 as the second transmission data TD2 through the second pad 124. The second data selection signal SEL_DQ2 may be generated in the transmitter 11 or may be provided by an external device.

The third output circuit 130 may include a third selector 131, a third latch circuit 132, a third driver 133 and a third pad 134. The third selector 131 may selectively output any one of the first internal clock signals ICLK1<1:N> as a third latch clock signal LCLK3 in response to a strobe selection signal SEL_DQS. The third latch circuit 132 may latch and output a data strobe signal DQS in synchronization with the third latch clock signal LCLK3. The third driver 133 may drive and output the data strobe signal DQS outputted from the third latch circuit 132 as the transmission data strobe signal TDQS through the third pad 134. The strobe selection signal SEL_DQS may be generated in the transmitter 11 or may be provided by an external device.

The first internal clock generation circuit 140 may generate the first internal clock signals ICLK1<1:N>. The first internal clock signals ICLK1<1:N> may include a plurality of clock signals having a plurality of phases which are different from each other. The first internal clock generation circuit 140 may include a phase locked loop (PLL) circuit and a divider to generate the first internal clock signals ICLK1<1:N>.

The first input circuit 150 may include a fourth pad 151, a fourth driver 152, a first delay circuit 153, a fourth selector 154 and a fourth latch circuit 155. The fourth driver 152 may drive and output the first transmission data TD1 inputted through the fourth pad 151. The first delay circuit 153 may receive and delay the first transmission data TD1 outputted from the fourth driver 152 by a first delay time to generate first delayed data Dd1. The fourth selector 154 may selectively output any one of second internal clock signals ICLK2<1:M> as a fourth latch clock signal LCLK4 in response to the first data selection signal SEL_DQ1. The second internal clock signals ICLK2<1:M> may include a plurality of clock signals having a plurality of phases. The fourth latch circuit 155 may latch and output the first delayed data Dd1 as first input data DIN1<1:4> in synchronization with the fourth latch clock signal LCLK4. The first data selection signal SEL_DQ1 may be generated in the receiver 15 or the transmitter 11.

The second input circuit 160 may include a fifth pad 161, a fifth driver 162, a second delay circuit 163, a fifth selector 164 and a fifth latch circuit 165. The fifth driver 162 may drive and output the second transmission data TD2 inputted through the fifth pad 161. The second delay circuit 163 may receive and delay the second transmission data TD2 outputted from the fifth driver 162 by a second delay time to generate second delayed data Dd2. The fifth selector 164 may selectively output any one of the second internal clock signals ICLK2<1:M> as a fifth latch clock signal LCLK5 in response to the second data selection signal SEL_DQ2. The fifth latch circuit 165 may latch and output the second delayed data Dd2 as second input data DIN2<1:4> in synchronization with the fifth latch clock signal LCLK5. The second data selection signal SEL_DQ2 may be generated in the receiver 15 or the transmitter 11.

The third input circuit 170 may include a sixth pad 171, a sixth driver 172 and a second internal clock generation circuit 173. The sixth driver 172 may drive and output the transmission data strobe signal TDQS inputted through the sixth pad 171. The second internal clock generation circuit 173 may receive the transmission data strobe signal TDQS driven by the sixth driver 172 to generate the second internal clock signals ICLK2<1:M>. The second internal clock signals ICLK2<1:M> may include a plurality of clock signals having a plurality of phases which are different from each other. The second internal clock generation circuit 173 may include a phase locked loop (PLL) circuit and a divider to generate the second internal clock signals ICLK2<1:M>.

An operation of the integrated circuit having an aforementioned configuration will be described hereinafter with reference to FIGS. 2 to 5.

The transmitter 11 may select any one of the clock signals included in the first internal clock signals ICLK1<1:N> as the first latch clock signal LCLK1 according to the first data selection signal SEL_DQ1 and may select any one of the clock signals included in the first internal clock signals ICLK1<1:N> as the second latch clock signal LCLK2 according to the second data selection signal SEL_DQ2. The transmitter 11 may select any one of the clock signals included in the first internal clock signals ICLK1<1:N> as the third latch clock signal LCLK3 according to the strobe selection signal SEL_DQS.

The transmitter 11 may latch and output the first output data DOUT1<1:4> as the first transmission data TD1 in synchronization with the first latch clock signal LCLK1 and may latch and output the second output data DOUT2<1:4> as the second transmission data TD2 in synchronization with the second latch clock signal LCLK2. The transmitter 11 may latch and output the data strobe signal DQS as the transmission data strobe signal TDQS in synchronization with the third latch clock signal LCLK3.

Figure 2:
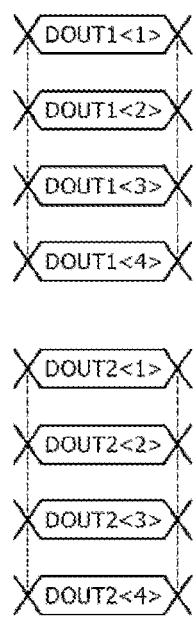
FIG. 2 illustrates waveforms of output data in the integrated circuit illustrated in FIG. 1.
Figure 3:
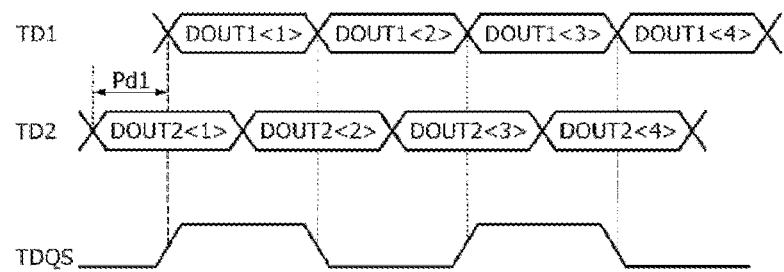
FIG. 3 illustrates waveforms of transmission data and transmission strobe signals in the integrated circuit illustrated in FIG. 1.

Referring to FIG. 2, waveforms of the first and second output data DOUT1<1:4> and DOUT2<1:4> may be aligned in parallel with each other. Referring to FIG. 3, waveforms of the first transmission data TD1, the second transmission data TD2 and the transmission data strobe signal TDQS may be provided. In an embodiment, the second latch clock signal LCLK2 and the third latch clock signal LCLK3 may be selected to have the same phase and may be set to precede the first latch clock signal LCLK1 by a phase of 90 degrees. Thus, as illustrated in FIG. 3, a first phase difference Pd1 between the first and second transmission data TD1 and TD2 may be set to be 90 degrees. Alternatively, the first phase difference Pd1 may be set to be different according to the embodiments. For example, in some other embodiments, the first phase difference Pd1 may be set to be 30 degrees, 45 degrees, 60 degrees or 135 degrees, etc.

The receiver 15 may delay the first transmission data TD1 by a first delay time to generate the first delayed data Dd1 and may delay the second transmission data TD2 by a second delay time to generate the second delayed data Dd2. The receiver 15 may generate the fourth and fifth latch clock signals LCLK4 and LCLK5 from the second internal clock signals ICLK2<1:M> which are generated from the transmission data strobe signal TDQS inputted through the third channel 14. The fourth latch clock signal LCLK4 may be selected from the clock signals included in the second internal clock signals ICLK2<1:M> according to the first data selection signal SEL_DQ1, and the fifth latch clock signal LCLK5 may be selected from the clock signals included in the second internal clock signals ICLK2<1:M> according to the second data selection signal SEL_DQ2.

Figure 4:
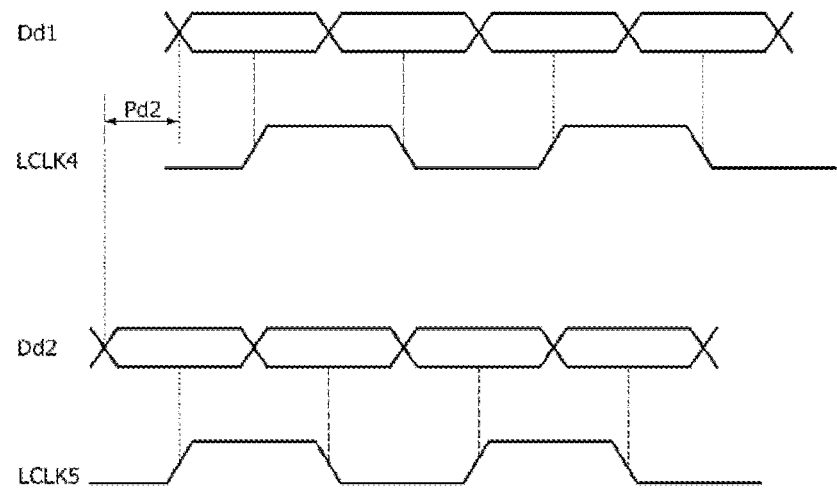
FIG. 4 illustrates waveforms of delay data and latch clocks in the integrated circuit illustrated in FIG. 1.
Figure 5:
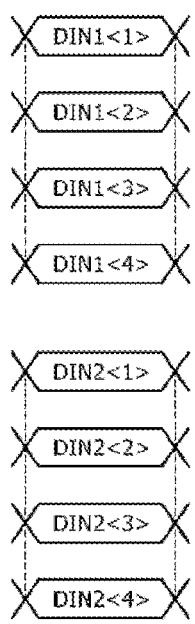
FIG. 5 illustrates waveforms of input data in the integrated circuit illustrated in FIG. 1.

Referring to FIG. 4, a waveform of the first delayed data Dd1 and a waveform of the second delayed data Dd2 may be provided to have a second phase difference Pd2, and a waveform of the fourth latch clock signal LCLK4 and a waveform of the fifth latch clock signal LCLK5 may also be provided to have the second phase difference Pd2. Since a phase difference between the fourth and fifth latch clock signals LCLK4 and LCLK5 is set to be equal to a phase difference between the first and second delayed data Dd1 and Dd2, the first and second input data DIN1<1:4> and DIN2<1:4> may be generated to be aligned in parallel with each other, as illustrated in FIG. 5.

As described above, the integrated circuit according to an embodiment may transmit the first transmission data TD1 through the first channel 12 in synchronization with the first latch clock signal LCLK1 whose phase is selected according to the first data selection signal SEL_DQ1 and may receive the first transmission data TD1 through the first channel 12 in synchronization with the fourth latch clock signal LCLK4 whose phase is selected according to the first data selection signal SEL_DQ1. The integrated circuit according to an embodiment may transmit the second transmission data TD2 through the second channel 13 in synchronization with the second latch clock signal LCLK2 whose phase is selected according to the second data selection signal SEL_DQ2 and may receive the second transmission data TD2 through the second channel 13 in synchronization with the fifth latch clock signal LCLK5 whose phase is selected according to the second data selection signal SEL_DQ2. Thus, the integrated circuit according to an embodiment may transmit the first and second transmission data TD1 and TD2 such that a phase of the first transmission data TD1 transmitted through the first channel 12 is different from a phase of the second transmission data TD2 transmitted through the second channel 13. As a result, deformation or distortion of the first and second transmission data TD1 and TD2 due to a cross-talk phenomenon may be prevented.

Figure 6:
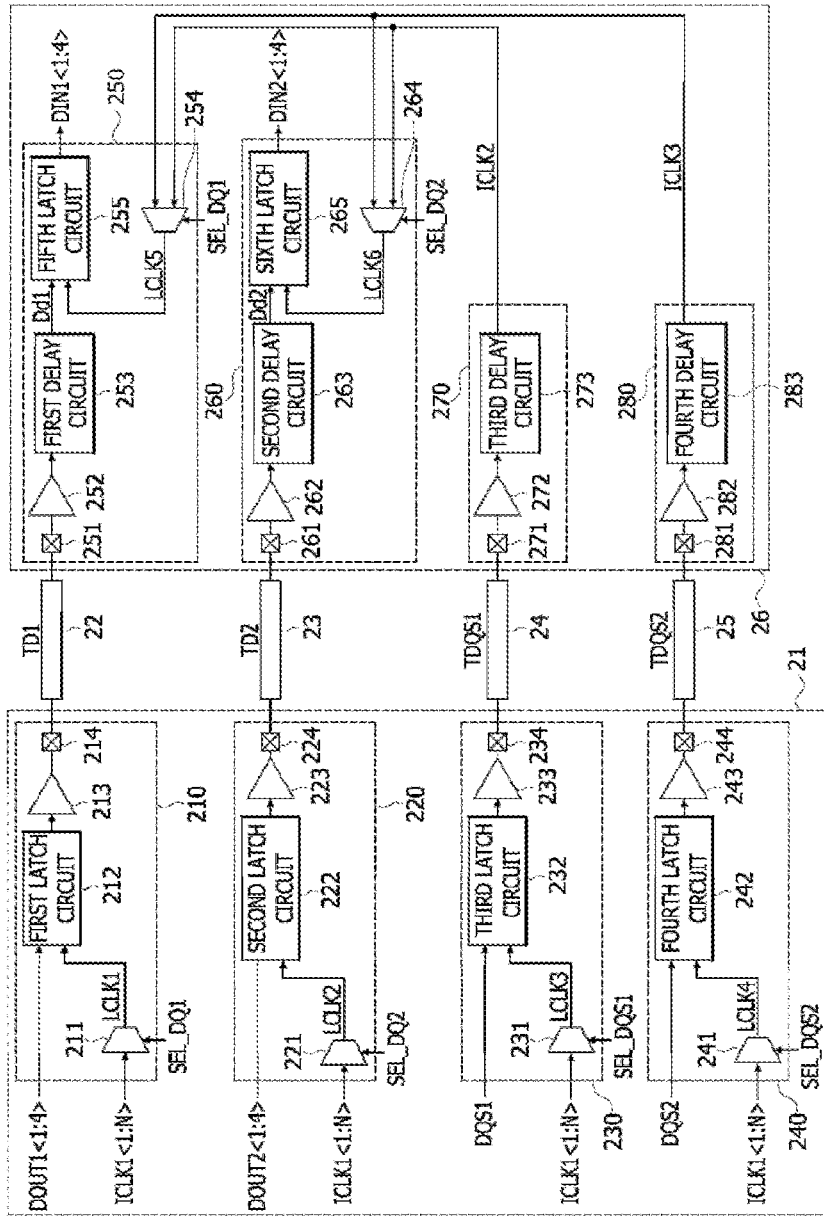
FIG. 6 is a block diagram illustrating a representation of an example of an integrated circuit according to an embodiment.

Referring to FIG. 6, an integrated circuit according to an embodiment may include a transmitter 21, a first channel 22, a second channel 23, a third channel 24, a fourth channel 25 and a receiver 26. The transmitter 21 may transmit first transmission data TD1 to the receiver 26 through the first channel 22. The transmitter 21 may transmit second transmission data TD2 to the receiver 26 through the second channel 23. The transmitter 21 may transmit a first transmission data strobe signal TDQS1 to the receiver 26 through the third channel 24. The transmitter 21 may transmit a second transmission data strobe signal TDQS2 to the receiver 26 through the fourth channel 25. The transmitter 21 may include a first output circuit 210, a second output circuit 220, a third output circuit 230 and a fourth output circuit 240. The receiver 26 may include a first input circuit 250, a second input circuit 260, a third input circuit 270 and a fourth input circuit 280.

The first output circuit 210 may include a first selector 211, a first latch circuit 212, a first driver 213 and a first pad 214. The first selector 211 may selectively output any one of first internal clock signals ICLK1<1:N> as a first latch clock signal LCLK1 in response to a first data selection signal SEL_DQ1. The first internal clock signals ICLK1<1:N> may include a plurality of clock signals having a plurality of phases. The first latch circuit 212 may latch and output first output data DOUT1<1:4> in synchronization with the first latch clock signal LCLK1. The first driver 213 may drive and output the first output data DOUT1<1:4> outputted from the first latch circuit 212 as the first transmission data TD1 through the first pad 214. The first data selection signal SEL_DQ1 may be generated in the transmitter 21 or may be provided by an external device.

The second output circuit 220 may include a second selector 221, a second latch circuit 222, a second driver 223 and a second pad 224. The second selector 221 may selectively output any one of the first internal clock signals ICLK1<1:N> as a second latch clock signal LCLK2 in response to a second data selection signal SEL_DQ2. The second latch circuit 222 may latch and output second output data DOUT2<1:4> in synchronization with the second latch clock signal LCLK2. The second driver 223 may drive and output the second output data DOUT2<1:4> outputted from the second latch circuit 222 as the second transmission data TD2 through the second pad 224. The second data selection signal SEL_DQ2 may be generated in the transmitter 21 or may be provided by an external device.

The third output circuit 230 may include a third selector 231, a third latch circuit 232, a third driver 233 and a third pad 234. The third selector 231 may selectively output any one of the first internal clock signals ICLK1<1:N> as a third latch clock signal LCLK3 in response to a first strobe selection signal SEL_DQS1. The third latch circuit 232 may latch and output a first data strobe signal DQS1 in synchronization with the third latch clock signal LCLK3. The third driver 233 may drive and output the first data strobe signal DQS1 outputted from the third latch circuit 232 as the first transmission data strobe signal TDQS1 through the third pad 234. The first strobe selection signal SEL_DQS1 may be generated in the transmitter 21 or may be provided by an external device.

The fourth output circuit 240 may include a fourth selector 241, a fourth latch circuit 242, a fourth driver 243 and a fourth pad 244. The fourth selector 241 may selectively output any one of the first internal clock signals ICLK1<1:N> as a fourth latch clock signal LCLK4 in response to a second strobe selection signal SEL_DQS2. The fourth latch circuit 242 may latch and output a second data strobe signal DQS2 in synchronization with the fourth latch clock signal LCLK4. The fourth driver 243 may drive and output the second data strobe signal DQS2 outputted from the fourth latch circuit 242 as the second transmission data strobe signal TDQS2 through the fourth pad 244. The second strobe selection signal SEL_DQS2 may be generated in the transmitter 21 or may be provided by an external device.

The first input circuit 250 may include a fifth pad 251, a fifth driver 252, a first delay circuit 253, a fifth selector 254 and a fifth latch circuit 255. The fifth driver 252 may drive and output the first transmission data TD1 inputted through the fifth pad 251. The first delay circuit 253 may receive and delay the first transmission data TD1 outputted from the fifth driver 252 by a first delay time to generate first delayed data Dd1. The fifth selector 254 may selectively output any one of second and third internal clock signals ICLK2 and ICLK3 as a fifth latch clock signal LCLK5 in response to the first data selection signal SEL_DQ1. The second internal clock signal ICLK2 and the third internal clock signal ICLK3 may be generated to have different phases. The fifth latch circuit 255 may latch and output the first delayed data Dd1 as first input data DIN1<1:4> in synchronization with the fifth latch clock signal LCLK5. The first data selection signal SEL_DQ1 may be generated in the receiver 26 or the transmitter 21.

The second input circuit 260 may include a sixth pad 261, a sixth driver 262, a second delay circuit 263, a sixth selector 264 and a sixth latch circuit 265. The sixth driver 262 may drive and output the second transmission data TD2 inputted through the sixth pad 261. The second delay circuit 263 may receive and delay the second transmission data TD2 outputted from the sixth driver 262 by a second delay time to generate second delayed data Dd2. The sixth selector 264 may selectively output any one of the second and third internal clock signals ICLK2 and ICLK3 as a sixth latch clock signal LCLK6 in response to the second data selection signal SEL_DQ2. The sixth latch circuit 265 may latch and output the second delayed data Dd2 as second input data DIN2<1:4> in synchronization with the sixth latch clock signal LCLK6. The second data selection signal SEL_DQ2 may be generated in the receiver 26 or the transmitter 21.

The third input circuit 270 may include a seventh pad 271, a seventh driver 272 and a third delay circuit 273. The seventh driver 272 may drive and output the first transmission data strobe signal TDQS1 inputted through the seventh pad 271. The third delay circuit 273 may receive and delay the first transmission data strobe signal TDQS1 outputted from the seventh driver 272 by a third delay time to generate the second internal clock signal ICLK2.

The fourth input circuit 280 may include an eighth pad 281, an eighth driver 282 and a fourth delay circuit 283. The eighth driver 282 may drive and output the second transmission data strobe signal TDQS2 inputted through the eighth pad 281. The fourth delay circuit 283 may receive and delay the second transmission data strobe signal TDQS2 outputted from the eighth driver 282 by a fourth delay time to generate the third internal clock signal ICLK3.

The integrated circuit according to an above embodiment may generate the fifth and sixth latch clock signals LCLK5 and LCLK6 for respectively latching the first and second delayed data Dd1 and Dd2 from the second and third internal clock signals ICLK2 and ICLK3, unlike the integrated circuit illustrated in FIG. 1. The second and third internal clock signals ICLK2 and ICLK3 may be generated from the first and second transmission data strobe signals TDQS1 and TDQS2, respectively. The first transmission data strobe signal TDQS1 may be a signal which is generated by latching and outputting the first data strobe signal DQS1 in synchronization with the third latch clock signal LCLK3, a phase of which is selected according to the first strobe selection signal SEL_DQS1, and the second transmission data strobe signal TDQS2 may be a signal which is generated by latching and outputting the second data strobe signal DQS2 in synchronization with the fourth latch clock signal LCLK4, a phase of which is selected according to the second strobe selection signal SEL_DQS2. A phase difference between the fifth and sixth latch clock signals LCLK5 and LCLK6 may be set to be different according to the embodiments. However, the phase difference between the fifth and sixth latch clock signals LCLK5 and LCLK6 may be set to be equal to a phase difference between the first and second latch clock signals LCLK1 and LCLK2.

The integrated circuit described with reference to FIG. 6 may transmit the first transmission data TD1 through the first channel 22 in synchronization with the first latch clock signal LCLK1 whose phase is selected according to the first data selection signal SEL_DQ1 and may receive the first transmission data TD1 through the first channel 22 in synchronization with the fifth latch clock signal LCLK5 whose phase is selected according to the first data selection signal SEL_DQ1. The integrated circuit illustrated in FIG. 6 may transmit the second transmission data TD2 through the second channel 23 in synchronization with the second latch clock signal LCLK2 whose phase is selected according to the second data selection signal SEL_DQ2 and may receive the second transmission data TD2 through the second channel 23 in synchronization with the sixth latch clock signal LCLK6 whose phase is selected according to the second data selection signal SEL_DQ2. Thus, the integrated circuit illustrated in FIG. 6 may transmit the first and second transmission data TD1 and TD2 such that a phase of the first transmission data TD1 transmitted through the first channel 22 is different from a phase of the second transmission data TD2 transmitted through the second channel 23. As a result, deformation or distortion of the first and second transmission data TD1 and TD2 due to a cross-talk phenomenon may be prevented.

Figure 7:
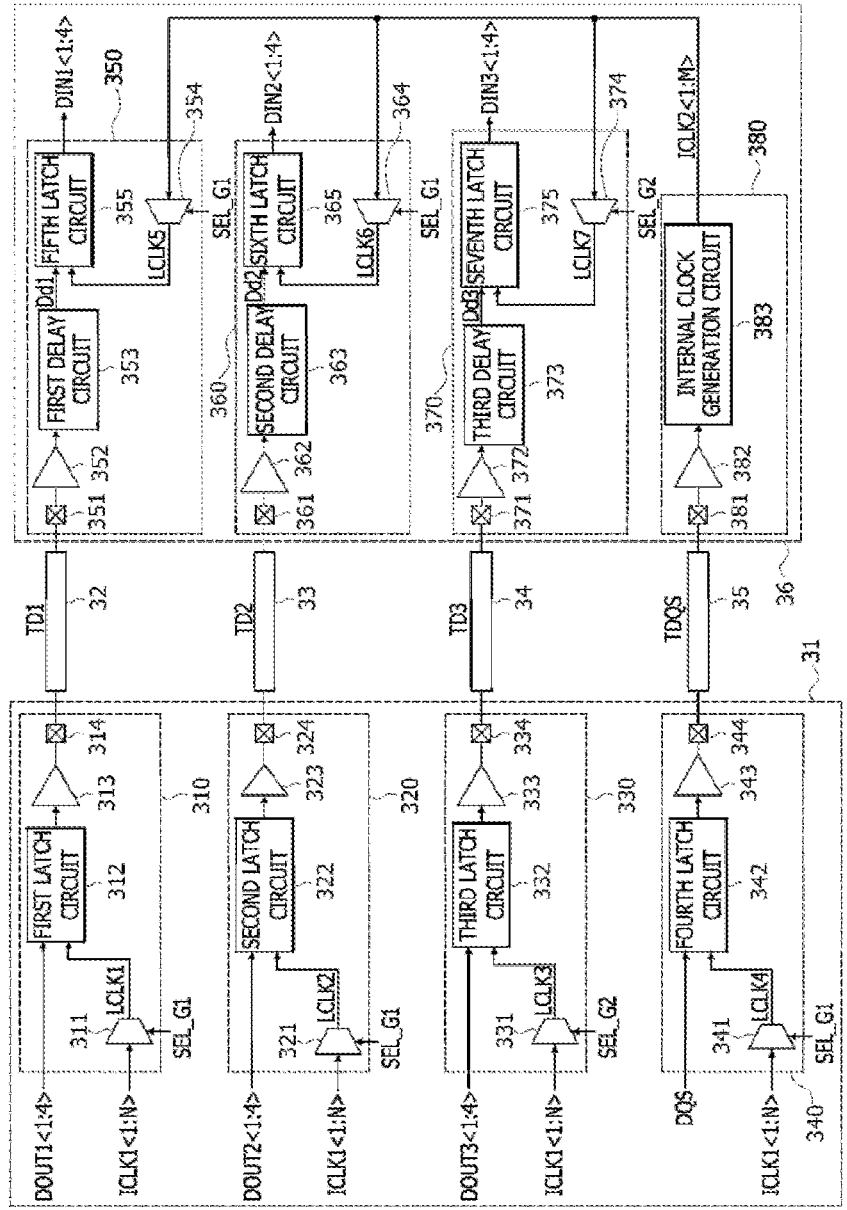
FIG. 7 is a block diagram illustrating a representation of an example of an integrated circuit according to an embodiment.

Referring to FIG. 7, an integrated circuit according to an embodiment may include a transmitter 31, a first channel 32, a second channel 33, a third channel 34, a fourth channel 35 and a receiver 36. The transmitter 31 may transmit first transmission data TD1 to the receiver 36 through the first channel 32. The transmitter 31 may transmit second transmission data TD2 to the receiver 36 through the second channel 33. The transmitter 31 may transmit third transmission data TD3 to the receiver 36 through the third channel 34. The transmitter 31 may transmit a transmission data strobe signal TDQS to the receiver 36 through the fourth channel 35. The transmitter 31 may include a first output circuit 310, a second output circuit 320, a third output circuit 330 and a fourth output circuit 340. The receiver 36 may include a first input circuit 350, a second input circuit 360, a third input circuit 370 and a fourth input circuit 380.

The first output circuit 310 may include a first selector 311, a first latch circuit 312, a first driver 313 and a first pad 314. The first selector 311 may selectively output any one of first internal clock signals ICLK1<1:N> as a first latch clock signal LCLK1 in response to a first group selection signal SEL_G1. The first internal clock signals ICLK1<1:N> may include a plurality of clock signals having a plurality of phases. The first latch circuit 312 may latch and output first output data DOUT1<1:4> in synchronization with the first latch clock signal LCLK1. The first driver 313 may drive and output the first output data DOUT1<1:4> outputted from the first latch circuit 312 as the first transmission data TD1 through the first pad 314. The first group selection signal SEL_G1 may be generated in the transmitter 31 or may be provided by an external device.

The second output circuit 320 may include a second selector 321, a second latch circuit 322, a second driver 323 and a second pad 324. The second selector 321 may selectively output any one of the first internal clock signals ICLK1<1:N> as a second latch clock signal LCLK2 in response to the first group selection signal SEL_G1. The second latch circuit 322 may latch and output second output data DOUT2<1:4> in synchronization with the second latch clock signal LCLK2. The second driver 323 may drive and output the second output data DOUT2<1:4> outputted from the second latch circuit 322 as the second transmission data TD2 through the second pad 324.

The third output circuit 330 may include a third selector 331, a third latch circuit 332, a third driver 333 and a third pad 334. The third selector 331 may selectively output any one of the first internal clock signals ICLK1<1:N> as a third latch clock signal LCLK3 in response to a second group selection signal SEL_G2. The third latch circuit 332 may latch and output third output data DOUT3<1:4> in synchronization with the third latch clock signal LCLK3. The third driver 333 may drive and output the third output data DOUT3<1:4> outputted from the third latch circuit 332 as the third transmission data TD3 through the third pad 334. The second group selection signal SEL_G2 may be generated in the transmitter 31 or may be provided by an external device.

The fourth output circuit 340 may include a fourth selector 341, a fourth latch circuit 342, a fourth driver 343 and a fourth pad 344. The fourth selector 341 may selectively output any one of the first internal clock signals ICLK1<1:N> as a fourth latch clock signal LCLK4 in response to the first group selection signal SEL_G1. The fourth latch circuit 342 may latch and output a data strobe signal DQS in synchronization with the fourth latch clock signal LCLK4. The fourth driver 343 may drive and output the data strobe signal DQS outputted from the fourth latch circuit 342 as the transmission data strobe signal TDQS through the fourth pad 344.

The first input circuit 350 may include a fifth pad 351, a fifth driver 352, a first delay circuit 353, a fifth selector 354 and a fifth latch circuit 355. The fifth driver 352 may drive and output the first transmission data TD1 inputted through the fifth pad 351. The first delay circuit 353 may receive and delay the first transmission data TD1 outputted from the fifth driver 352 by a first delay time to generate first delayed data Dd1. The fifth selector 354 may selectively output any one of second internal clock signals ICLK2<1:M> as a fifth latch clock signal LCLK5 in response to the first group selection signal SEL_G1. The second internal clock signals ICLK2<1:M> may include a plurality of clock signals having a plurality of phases. The fifth latch circuit 355 may latch and output the first delayed data Dd1 as first input data DIN1<1:4> in synchronization with the fifth latch clock signal LCLK5. The first group selection signal SEL_G1 may be generated in the receiver 36 or the transmitter 31.

The second input circuit 260 may include a sixth pad 361, a sixth driver 362, a second delay circuit 363, a sixth selector 364 and a sixth latch circuit 365. The sixth driver 362 may drive and output the second transmission data TD2 inputted through the sixth pad 361. The second delay circuit 363 may receive and delay the second transmission data TD2 outputted from the sixth driver 362 by a second delay time to generate second delayed data Dd2. The sixth selector 364 may selectively output any one of the second internal clock signals ICLK2<1:M> as a sixth latch clock signal LCLK6 in response to the first group selection signal SEL_G1. The sixth latch circuit 365 may latch and output the second delayed data Dd2 as second input data DIN2<1:4> in synchronization with the sixth latch clock signal LCLK6.

The third input circuit 370 may include a seventh pad 371, a seventh driver 372, a third delay circuit 373, a seventh selector 374 and a seventh latch circuit 375. The seventh driver 372 may drive and output the third transmission data TD3 inputted through the seventh pad 371. The third delay circuit 373 may receive and delay the third transmission data TD3 outputted from the seventh driver 372 by a third delay time to generate third delayed data Dd3. The seventh selector 374 may selectively output any one of the second internal clock signals ICLK2<1:M> as a seventh latch clock signal LCLK7 in response to the second group selection signal SEL_G2. The seventh latch circuit 375 may latch and output the third delayed data Dd3 as third input data DIN3<1:4> in synchronization with the seventh latch clock signal LCLK7. The second group selection signal SEL_G2 may be generated in the receiver 36 or the transmitter 31.

The fourth input circuit 380 may include an eighth pad 381, an eighth driver 382 and an internal clock generation circuit 383. The eighth driver 382 may drive and output the transmission data strobe signal TDQS inputted through the eighth pad 381. The internal clock generation circuit 383 may receive the transmission data strobe signal TDQS outputted from the eighth driver 382 to generate the second internal clock signals ICLK2<1:M>. The second internal clock signals ICLK2<1:M> may include a plurality of clock signals having a plurality of phases which are different from each other. The internal clock generation circuit 383 may include a phase locked loop (PLL) circuit and a divider to generate the second internal clock signals ICLK2<1:M>.

The integrated circuits described with reference to FIG. 7 may transmit the first and second transmission data TD1 and TD2 through the first and second channels 32 and 33 in synchronization with the first and second latch clock signals LCLK1 and LCLK2 whose phases are selected according to the first group selection signal SEL_G1 and may receive the first and second transmission data TD1 and TD2 through the first and second channels 32 and 33 in synchronization with the fifth and sixth latch clock signals LCLK5 and LCLK6 whose phases are selected according to the first group selection signal SEL_G1. The integrated circuits illustrated in FIG. 7 may transmit the third transmission data TD3 through the third channel 34 in synchronization with the third latch clock signal LCLK3 whose phase is selected according to the second group selection signal SEL_G2 and may receive the third transmission data TD3 through the third channel 34 in synchronization with the seventh latch clock signal LCLK7 whose phase is selected according to the second group selection signal SEL_G2. Thus, the integrated circuit illustrated in FIG. 7 may transmit the first, second and third transmission data TD1, TD2 and TD3 such that a phase of the first and second transmission data TD1 and TD2 transmitted through the first and second channels 32 and 33 is different from a phase of the third transmission data TD3 transmitted through the third channel 34. As a result, deformation or distortion of the first to third transmission data TD1, TD2 and TD3 due to a cross-talk phenomenon may be prevented.

Figure 8:
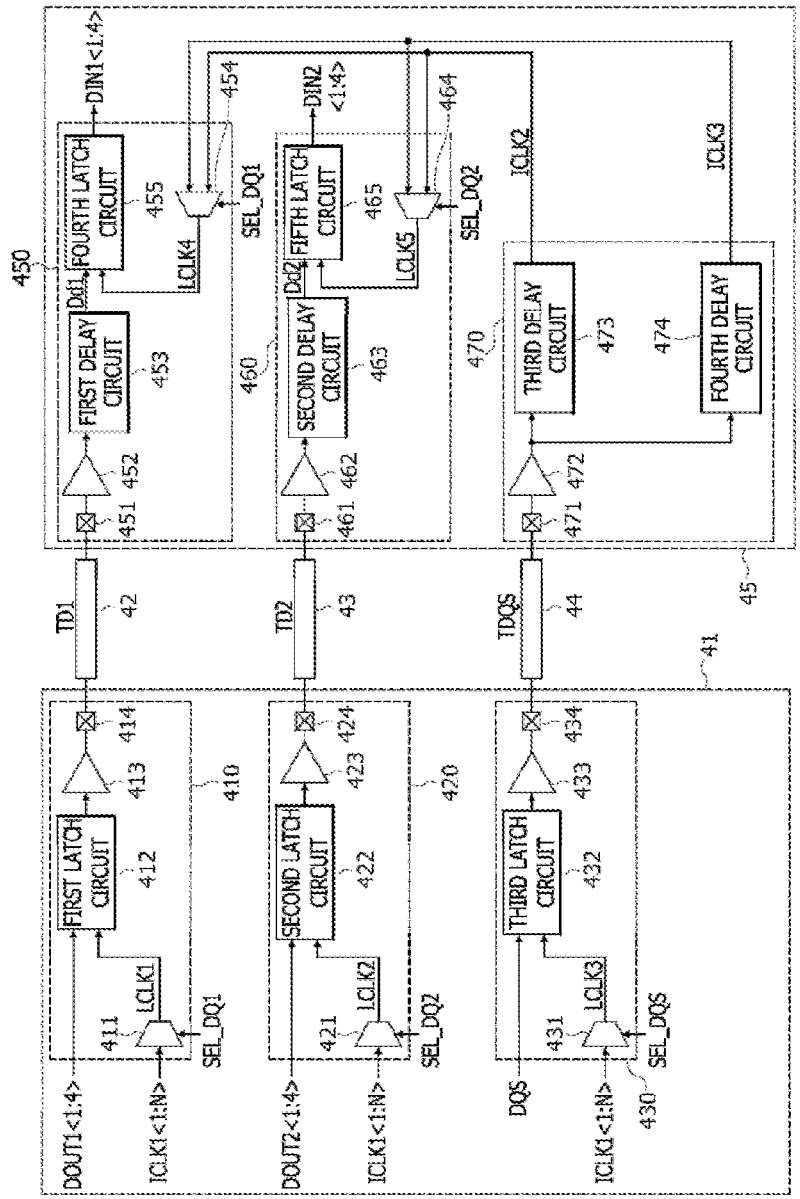
FIG. 8 is a block diagram illustrating a representation of an example of an integrated circuit according to an embodiment.

Referring to FIG. 8, an integrated circuit according to an embodiment may include a transmitter 41, a first channel 42, a second channel 43, a third channel 44 and a receiver 45. The transmitter 41 may transmit first transmission data TD1 to the receiver 45 through the first channel 42. The transmitter 41 may transmit second transmission data TD2 to the receiver 45 through the second channel 43. The transmitter 41 may transmit a transmission data strobe signal TDQS to the receiver 45 through the third channel 44. The transmitter 41 may include a first output circuit 410, a second output circuit 420 and a third output circuit 430. The receiver 45 may include a first input circuit 450, a second input circuit 460 and a third input circuit 470.

The first output circuit 410 may include a first selector 411, a first latch circuit 412, a first driver 413 and a first pad 414. The first selector 411 may selectively output any one of first internal clock signals ICLK1<1:N> as a first latch clock signal LCLK1 in response to a first data selection signal SEL_DQ1. The first internal clock signals ICLK1<1:N> may include a plurality of clock signals having a plurality of phases. The first latch circuit 412 may latch and output first output data DOUT1<1:4> in synchronization with the first latch clock signal LCLK1. The first driver 413 may drive and output the first output data DOUT1<1:4> outputted from the first latch circuit 412 as the first transmission data TD1 through the first pad 414. The first data selection signal SEL_DQ1 may be generated in the transmitter 41 or may be provided by an external device.

The second output circuit 420 may include a second selector 421, a second latch circuit 422, a second driver 423 and a second pad 424. The second selector 421 may selectively output any one of the first internal clock signals ICLK1<1:N> as a second latch clock signal LCLK2 in response to a second data selection signal SEL_DQ2. The second latch circuit 422 may latch and output second output data DOUT2<1:4> in synchronization with the second latch clock signal LCLK2. The second driver 423 may drive and output the second output data DOUT2<1:4> outputted from the second latch circuit 422 as the second transmission data TD2 through the second pad 424. The second data selection signal SEL_DQ2 may be generated in the transmitter 41 or may be provided by an external device.

The third output circuit 430 may include a third selector 431, a third latch circuit 432, a third driver 433 and a third pad 434. The third selector 431 may selectively output any one of the first internal clock signals ICLK1<1:N> as a third latch clock signal LCLK3 in response to a strobe selection signal SEL_DQS. The third latch circuit 432 may latch and output a data strobe signal DQS in synchronization with the third latch clock signal LCLK3. The third driver 433 may drive and output the data strobe signal DQS outputted from the third latch circuit 432 as the transmission data strobe signal TDQS through the third pad 434. The strobe selection signal SEL_DQS may be generated in the transmitter 41 or may be provided by an external device.

The first input circuit 450 may include a fourth pad 451, a fourth driver 452, a first delay circuit 453, a fourth selector 454 and a fourth latch circuit 455. The fourth driver 452 may drive and output the first transmission data TD1 inputted through the fourth pad 451. The first delay circuit 453 may receive and delay the first transmission data TD1 outputted from the fourth driver 452 by a first delay time to generate first delayed data Dd1. The fourth selector 454 may selectively output any one of second and third internal clock signals ICLK2 and ICLK3 as a fourth latch clock signal LCLK4 in response to the first data selection signal SEL_DQ1. The second internal clock signal ICLK2 and the third internal clock signal ICLK3 may be generated to have different phases. The fourth latch circuit 455 may latch and output the first delayed data Dd1 as first input data DIN1<1:4> in synchronization with the fourth latch clock signal LCLK4. The first data selection signal SEL_DQ1 may be generated in the receiver 45 or the transmitter 41.

The second input circuit 460 may include a fifth pad 461, a fifth driver 462, a second delay circuit 463, a fifth selector 464 and a fifth latch circuit 465. The fifth driver 462 may drive and output the second transmission data TD2 inputted through the fifth pad 461. The second delay circuit 463 may receive and delay the second transmission data TD2 outputted from the fifth driver 462 by a second delay time to generate second delayed data Dd2. The fifth selector 464 may selectively output any one of the second and third internal clock signals ICLK2 and ICLK3 as a fifth latch clock signal LCLK5 in response to the second data selection signal SEL_DQ2. The fifth latch circuit 465 may latch and output the second delayed data Dd2 as second input data DIN2<1:4> in synchronization with the fifth latch clock signal LCLK5. The second data selection signal SEL_DQ2 may be generated in the receiver 45 or the transmitter 41.

The third input circuit 470 may include a sixth pad 471, a sixth driver 472, a third delay circuit 473 and a fourth delay circuit 474. The sixth driver 472 may drive and output the transmission data strobe signal TDQS inputted through the sixth pad 471. The third delay circuit 473 may receive and delay the transmission data strobe signal TDQS outputted from the sixth driver 472 by a third delay time to generate the second internal clock signal ICLK2. The fourth delay circuit 474 may receive and delay the transmission data strobe signal TDQS outputted from the sixth driver 472 by a fourth delay time to generate the third internal clock signal ICLK3.

The integrated circuit described with reference to FIG. 8 may generate the fourth and fifth latch clock signals LCLK4 and LCLK5 for respectively latching the first and second delayed data Dd1 and Dd2 from the second and third internal clock signals ICLK2 and ICLK3. The second and third internal clock signals ICLK2 and ICLK3 may be generated from the transmission data strobe signals TDQS. The transmission data strobe signal TDQS may be a signal which is generated by latching and outputting the data strobe signal DQS in synchronization with the third latch clock signal LCLK3, a phase of which is selected according to the strobe selection signal SEL_DQS. A phase difference between the fourth and fifth latch clock signals LCLK4 and LCLK5 may be set to be different according to the embodiments. However, the phase difference between the fourth and fifth latch clock signals LCLK4 and LCLK5 may be set to be equal to a phase difference between the first and second latch clock signals LCLK1 and LCLK2.

The integrated circuit described with reference to FIG. 8 may transmit the first transmission data TD1 through the first channel 42 in synchronization with the first latch clock signal LCLK1 whose phase is selected according to the first data selection signal SEL_DQ1 and may receive the first transmission data TD1 through the first channel 42 in synchronization with the fourth latch clock signal LCLK4 whose phase is selected according to the first data selection signal SEL_DQ1. The integrated circuit illustrated in FIG. 8 may transmit the second transmission data TD2 through the second channel 43 in synchronization with the second latch clock signal LCLK2 whose phase is selected according to the second data selection signal SEL_DQ2 and may receive the second transmission data TD2 through the second channel 43 in synchronization with the fifth latch clock signal LCLK5 whose phase is selected according to the second data selection signal SEL_DQ2. The integrated circuit illustrated in FIG. 8 may transmit the first and second transmission data TD1 and TD2 such that a phase of the first transmission data TD1 transmitted through the first channel 42 is different from a phase of the second transmission data TD2 transmitted through the second channel 43. As a result, deformation or distortion of the first and second transmission data TD1 and TD2 due to a cross-talk phenomenon may be prevented.

Figure 9:
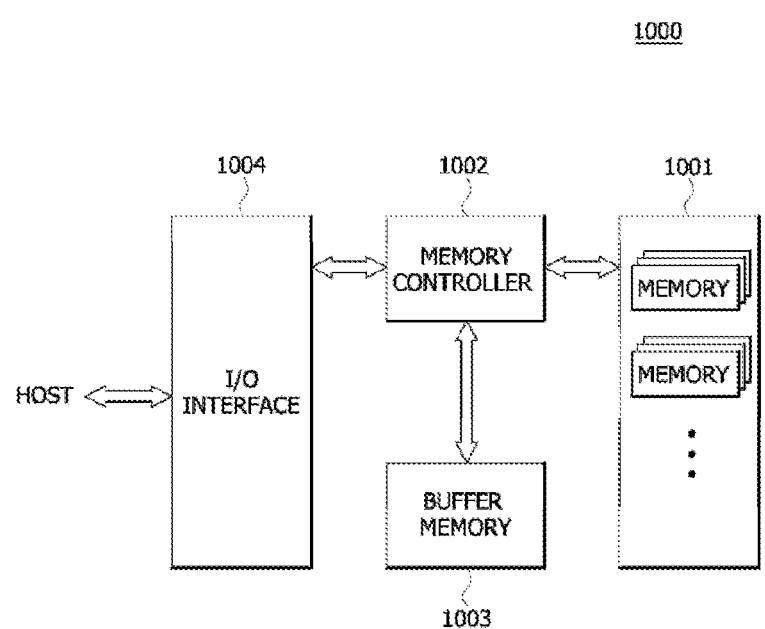
FIG. 9 is a block diagram illustrating a configuration of an electronic system employing at least one of the integrated circuits illustrated in FIGS. 1 to 8.

At least one of the integrated circuits described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

The transmitter and the receiver included in at least one of the integrated circuits according to the embodiments described above may be coupled between the host and the I/O interface 1004, between the I/O interface 1004 and the memory controller 1002, between the memory controller 1002 and the buffer memory 1003, and/or between the memory controller 1002 and the data storage circuit 1001.

According to the embodiments, channels may be classified into a plurality of groups, and data may be transmitted with time lags according to the groups of channel. Thus, deformation or distortion of the data transmitted through the channels due to a cross-talk phenomenon may be prevented.

What is claimed is:

1. An integrated circuit comprising:
   a transmitter configured to output first transmission data generated by latching output data according to a first latch clock signal to a first channel and configured to output second transmission data generated by latching the output data according to a second latch clock signal to a second channel; and
   a receiver configured to latch the first transmission data to generate input data according to a third latch clock signal and configured to latch the second transmission data to generate the input data according to a fourth latch clock signal, wherein the first latch clock signal is selected from first internal clock signals including a plurality of clock signals having different phases, based on a first data selection signal; and wherein the second latch clock signal is selected from the first internal clock signals based on a second data selection signal.

2. The integrated circuit of claim 1, wherein the first latch clock signal and the second latch clock signal have different phases.

3. The integrated circuit of claim 1, wherein a phase difference between the third and fourth latch clock signals is set to be equal to a phase difference between the first and second latch clock signals.

4. The integrated circuit of claim 1, wherein the first and second data selection signals are generated in the transmitter or an external device.

5. The integrated circuit of claim 1, wherein the transmitter includes a first output circuit that is configured to select the first latch clock signal from the first internal clock signals based on the first data selection signal and that is configured to latch and output the output data as the first transmission data in synchronization with the first latch clock signal.

6. The integrated circuit of claim 5, wherein the first output circuit incudes:
 a selector configured to selectively output the first latch clock signal from the first internal clock signals based on the first data selection signal;
 a latch circuit configured to latch and output the output data in synchronization with the first latch clock signal; and
 a driver configured to drive and output an output signal of the latch circuit through a pad.

7. The integrated circuit of claim 5, wherein the transmitter further includes a second output circuit that is configured to select the second latch clock signal from the first internal clock signals based on the second data selection signal and that is configured to latch and output the output data as the second transmission data in synchronization with the second latch clock signal.

8. The integrated circuit of claim 1, wherein the transmitter is configured to select a fifth latch clock signal from the first internal clock signals based on a strobe selection signal and is configured to latch and output a data strobe signal as a transmission data strobe signal in synchronization with the fifth latch clock signal.

9. The integrated circuit of claim 1, wherein the receiver includes a first input circuit that is configured to select the third latch clock signal from second internal clock signals based on the first data selection signal and that is configured to latch the first transmission data to generate the input data in synchronization with the third latch clock signal.

10. The integrated circuit of claim 9, wherein the first input circuit includes:
 a driver configured to drive and output the first transmission data;
 a delay circuit configured to delay the first transmission data by a predetermined delay time to generate delayed data;
 a selector configured to selectively output the third latch clock signal from the second internal clock signals based on the first data selection signal; and
 a latch circuit configured to latch and output the delayed data as the input data in synchronization with the third latch clock signal.

11. The integrated circuit of claim 9, wherein the receiver further includes a second input circuit that is configured to select the fourth latch clock signal from the second internal clock signals based on the second data selection signal and that is configured to latch the second transmission data to generate the input data in synchronization with the fourth latch clock signal.

12. The integrated circuit of claim 1, wherein the receiver is configured to drive a transmission data strobe signal to generate second internal clock signals for generating the third and fourth latch clock signals.

13. An integrated circuit comprising:
 a first output circuit configured to select a first latch clock signal based on a first data selection signal and configured to latch output data to output the latched output data as first transmission data in synchronization with the first latch clock signal, wherein the first transmission data are outputted to a first channel;
 a second output circuit configured to select a second latch clock signal based on a second data selection signal and configured to latch output data to output the latched output data as second transmission data in synchronization with the second latch clock signal, wherein the second transmission data are outputted to a second channel;
 a first input circuit configured to select a third latch clock signal based on the first data selection signal and configured to latch the first transmission data to generate input data in synchronization with the third latch clock signal; and
 a second input circuit configured to select a fourth latch clock signal based on the second data selection signal and configured to latch the second transmission data to generate the input data in synchronization with the fourth latch clock signal.

14. The integrated circuit of claim 13,
 wherein the first latch clock signal and the second latch clock signal have different phases; and
 wherein a phase difference between the third and fourth latch clock signals is set to be equal to the phase difference between the first and second latch clock signals.

15. The integrated circuit of claim 13, further comprising a third output circuit configured to select a fifth latch clock signal from first internal clock signals based on a first strobe selection signal and configured to latch and output a first data strobe signal as a first transmission data strobe signal in synchronization with the fifth latch clock signal,
 wherein the first transmission data strobe signal is outputted to a third channel.

16. The integrated circuit of claim 15, further comprising a third input circuit configured to drive the first transmission data strobe signal to generate a second internal clock signal for generating the third and fourth latch clock signals.

17. The integrated circuit of claim 16, further comprising a fourth output circuit configured to select a sixth latch clock signal from the first internal clock signals based on a second strobe selection signal and configured to latch and output a second data strobe signal as a second transmission data strobe signal in synchronization with the sixth latch clock signal,
 wherein the second transmission data strobe signal is outputted to a fourth channel.

18. The integrated circuit of claim 17, further comprising a fourth input circuit configured to drive the second transmission data strobe signal to generate a third internal clock signal for generating the third and fourth latch clock signals.

19. An integrated circuit comprising:
a first output circuit configured to select a first latch clock signal based on a first group selection signal and configured to latch output data to output the latched output data as first transmission data in synchronization with the first latch clock signal, wherein the first transmission data are outputted to a first channel;
a second output circuit configured to select a second latch clock signal based on the first group selection signal and configured to latch the output data to output the latched output data as second transmission data in synchronization with the second latch clock signal, wherein the second transmission data are outputted to a second channel;
a third output circuit configured to select a third latch clock signal based on a second group selection signal and configured to latch the output data to output the latched output data as third transmission data in synchronization with the third latch clock signal, wherein the third transmission data are outputted to a third channel;
a first input circuit configured to select a fourth latch clock signal based on the first group selection signal and configured to latch the first transmission data to generate input data in synchronization with the fourth latch clock signal;
a second input circuit configured to select a fifth latch clock signal based on the first group selection signal and configured to latch the second transmission data to generate the input data in synchronization with the fifth latch clock signal; and
a third input circuit configured to select a sixth latch clock signal based on the second group selection signal and configured to latch the third transmission data to generate the input data in synchronization with the sixth latch clock signal.

20. The integrated circuit of claim 19, further comprising a fourth output circuit configured to select a seventh latch clock signal based on the first group selection signal and configured to latch a data strobe signal to output the latched signal as a transmission data strobe signal in synchronization with the seventh latch clock signal,
wherein the transmission data strobe signal is outputted to a fourth channel.

21. The integrated circuit of claim 20, further comprising a fourth input circuit configured to drive the transmission data strobe signal to generate second internal clock signals for generating the fourth, fifth and sixth latch clock signals.

* * * * *